(12) United States Patent
Kronholz et al.

(10) Patent No.: US 8,440,561 B2
(45) Date of Patent: May 14, 2013

(54) THREE-DIMENSIONAL SEMICONDUCTOR DEVICE COMPRISING AN INTER-DIE CONNECTION ON THE BASIS OF FUNCTIONAL MOLECULES

(75) Inventors: Stephan Kronholz, Dresden (DE); Markus Lenski, Dresden (DE); Ralf Richter, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 310 days.

(21) Appl. No.: 12/844,263

(22) Filed: Jul. 27, 2010

(65) Prior Publication Data
US 2011/0024914 A1    Feb. 3, 2011

(30) Foreign Application Priority Data
Jul. 31, 2009    (DE) .......................... 10 2009 035 436

(51) Int. Cl.
  *H01L 27/14*    (2006.01)
(52) U.S. Cl.
  USPC ..... 438/637; 438/628; 438/629; 257/E21.584
(58) Field of Classification Search .......... 438/628–629, 438/637–640, 612, 107
  See application file for complete search history.

(56) References Cited

U.S. PATENT DOCUMENTS

| | | | | |
|---|---|---|---|---|
| 6,989,325 | B2 | 1/2006 | Uang et al. | 438/613 |
| 7,566,643 | B2* | 7/2009 | Czubatyi et al. | 438/584 |
| 2005/0142933 | A1 | 6/2005 | Beer et al. | 439/540.1 |
| 2005/0270822 | A1* | 12/2005 | Shrivastava et al. | 365/149 |
| 2008/0116451 | A1* | 5/2008 | Lee et al. | 257/40 |

OTHER PUBLICATIONS

Ackermann et al., "Micro-patterning of self-supporting layers with conducting polymer wires for 3D-chip interconnection applications." *Applied Surface Science*, 212-213, 2003, pp. 411-416.
Crawley et al., "3D molecular interconnection technology," *J. of Micromechanics and Microengineering*, vol. 13, 2003, pp. 655-662.
Translation of Official Communication from German Patent Office for German Patent Application No. 10 2009 035 436.0-33 dated Aug. 1, 2010.

* cited by examiner

*Primary Examiner* — Thanh Nguyen
(74) *Attorney, Agent, or Firm* — Williams, Morgan & Amerson, P.C.

(57) ABSTRACT

In a stacked chip configuration, the "inter chip" connection is established on the basis of functional molecules, thereby providing a fast and space-efficient communication between the different semiconductor chips.

13 Claims, 7 Drawing Sheets

THREE-DIMENSIONAL SEMICONDUCTOR DEVICE COMPRISING AN INTER-DIE CONNECTION ON THE BASIS OF FUNCTIONAL MOLECULES

BACKGROUND OF THE INVENTION

1. Field of the Invention

The present disclosure generally relates to the field of fabricating integrated circuits, and, more particularly, to interconnect structures for connecting different device levels or chips.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are continuously decreased with the introduction of every new circuit generation, to provide currently available integrated circuits formed by volume production techniques with critical dimensions of 40 nm or less and having an improved degree of performance in terms of speed and/or power consumption. A reduction in size of transistors has been an important aspect in steadily improving device performance of complex integrated circuits, such as CPUs, GPUs (graphical processing units), memory devices and the like. The reduction in size is commonly associated with an increased switching speed, thereby enhancing signal processing performance at transistor level.

In addition to the large number of transistor elements, a plurality of passive circuit elements, such as capacitors, resistors, interconnect structures and the like, are typically formed in integrated circuits, as required by the basic circuit layout. Due to the decreased dimensions of the active circuit elements, not only the performance of the individual transistor elements may be increased, but also their packing density is improved, thereby providing the potential for incorporating additional functionality into a given chip area. For this reason, highly complex circuits based on CMOS technology have been developed, which may include different types of circuits, such as analog circuits, digital circuits and the like, thereby providing entire systems on a single chip (SoC).

Although transistor elements are the dominant circuit element in highly complex integrated circuits based on high end CMOS techniques which substantially determine the overall performance of these devices, other components such as capacitors and resistors and in particular a complex interconnect system or metallization system may be required, wherein the size of these passive circuit elements may also have to be adjusted with respect to the scaling of the transistor elements in order to not unduly consume valuable chip area.

Typically, as the number of circuit elements, such as transistors and the like, per unit area may increase in the device level of a corresponding semiconductor device, the number of electrical connections associated with the circuit elements in the device level also grows, typically even in an over-proportional manner, thereby requiring complex interconnect structures which may be provided in the form of metallization systems including a plurality of stacked metallization layers. In these metallization layers, metal lines, providing the inner-level electrical connection, and vias, providing intra-level connections, may be formed on the basis of highly conductive metals, such as copper and the like, in combination with appropriate dielectric materials to reduce the parasitic RC (resistance capacitance) time constants, since, in sophisticated semiconductor devices, typically, signal propagation delay may be substantially restricted by a metallization system rather than the transistor elements in the device level. However, expanding the metallization system in the height dimension so as to provide the desired density of interconnect structures may be restricted by the parasitic RC time constants and the limitations imposed by the material characteristics of sophisticated low-k dielectrics. That is, typically, a reduced dielectric constant is associated with reduced mechanical stability of these dielectric materials, thereby also restricting the number of metallization layers that may be stacked on top of each other in view of yield losses during the various fabrication steps and the reduced reliability during operation of the semiconductor device. Thus, the complexity of semiconductor devices provided in a single semiconductor chip may be restricted by the capabilities of the corresponding metallization system and in particular by the characteristics of sophisticated low-k dielectric materials, since the number of metallization layers may not be arbitrarily increased.

For this reason, it has also been proposed to further enhance the overall density of circuit elements for a given size or area of a respective package by stacking two or more individual semiconductor chips, which may be fabricated in an independent manner, however, with a correlated design so as to provide in total a complex system, while avoiding many of the problems encountered during the fabrication process for extremely complex semiconductor devices on a single chip. For example, appropriately selected functional units, such as memory areas and the like, may be formed on a single chip in accordance with well-established manufacturing techniques including the fabrication of a corresponding metallization system, while the required other functional units, such as a fast and powerful logic circuitry, may be formed independently as a separate chip, wherein, however, respective interconnect systems may enable a subsequent stacking and attaching of the individual chips so as to form an overall functional circuit, which may then be packaged as a single unit. Similarly, different complex circuit portions, such as a CPU and a GPU, may be manufactured individually and may be subsequently combined into a stacked configuration. Thus, a corresponding three-dimensional configuration may provide increased density of circuit elements and metallization features with respect to a given area of a package, since a significant larger amount of the available volume in a package may be used by stacking individual semiconductor chips. Although this technique represents a promising approach for enhancing packing density and functionality for a given package size for a given technology standard, while postponing the problems of sophisticated CMOS techniques as these techniques may encounter fundamental physical limitations upon further device scaling, appropriate contact elements may have to be provided to enable the electrical connections of the individual semi-conductor chips in a reliable and well-performing manner.

To this end, it has been suggested to form through-hole vias through the substrate material of at least one of the chips so as to enable electrical contact to corresponding contact elements of a second semiconductor chip, while the metallization system of the first semi-conductor chip may further be available for connecting to other semiconductor chips or a package substrate and the like. Furthermore, appropriate contact structures, for instance including contact pads for receiving solder bump materials, bond wires and the like, are conventionally provided in order to establish the electrical connection between the individual semiconductor chips. As discussed above, in some cases, the circuits implemented in the individual semiconductor chips may have a moderately high degree of complexity, thereby also requiring an appropriate "inter chip" wiring system for exchanging the required signals between the individual semiconductor chips. For example, if a CPU core and an extended memory area are to be provided in different semiconductor chips, the corresponding address and control signals, as well as the data signals, have to be exchanged between the different semiconductor chips, thereby requiring efficient communication channels. Similarly, if such entities, such as a CPU and a GPU, are to be connected in a stacked configuration, a moderately complex wiring system is also required. Consequently, the corresponding contact structure may have a more or less complex design and may also require significant floor space, since conventional contact mechanisms based on wire bonding and/or direct bonding of appropriate contact bumps may not be scaled down in a desired manner. Consequently, significant advantages of increased transistor density obtained by providing a stacked semi-conductor configuration may be offset by the requirements of a complex "inter chip" contact structure.

Recently, concepts have been proposed for further increasing the packing density of integrated circuit devices by using specifically designed functional molecules to form molecular films having specifically designed characteristics. For example, organic base molecules may be appropriately designed so as to include functional groups for imparting the desired characteristics, such as conductivity and the like, to the molecules in order to act as conductors or even as switches when, for instance, the conductivity of these functional molecules may be changed on the basis of external stimuli, such as light, heat, electric fields, i.e., voltages, and the like. Consequently, great efforts are being made in order to develop molecular electronic systems based on molecular conductors and switchable elements, wherein, however, the combination of these components to form complex electronic circuits may still require extensive research. Furthermore, presently, it is not clear as to how these concepts may be implemented into volume production techniques so as to provide a cost efficiency that is comparable to present day sophisticated CMOS techniques.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and techniques in which the stacking of different device layers may be performed on the basis of a contact structure including functional molecules, which may be appropriately positioned in a dielectric material so as to connect to associated contact pads of the different device levels. In this manner, sophisticated CMOS process techniques may be efficiently combined with concepts of molecular electronics, however, without requiring sophisticated patterning techniques, such as electron beam lithography and the like, in order to provide specifically patterned molecular films. In some illustrative aspects disclosed herein, functional molecules, for instance in the form of "nano wires" or any other conductive polymer chains, may be applied so as to connect to contact pads of different semiconductor chips without requiring complex contact structures on the basis of solder bumps, bond pads and the like. Consequently, a significant reduction in overall lateral dimensions of a corresponding layout of a contact structure may be realized on the basis of the functional molecules, thereby also achieving a gain in performance due to the possibility of providing fast interconnect structures between individual semiconductor chips. In other illustrative embodiments, the functional molecules may be provided as molecular switches so that the contact structure between two different device levels or two different semiconductor chips may itself be used for "storing" information, for instance by generating a specified bit pattern, which may be used for controlling device operation and the like. For instance, the corresponding molecular switches may be appropriately programmed, for instance, during manufacturing of the semiconductor devices or even during operation of the devices on the basis of specifically applied stimuli, such as voltages, in order to control operation and/or communication between the different device levels. In this case, the functional molecules may also act as efficient electronic fuses, which may be provided in a very space-efficient manner.

Furthermore, by specifically adapting the characteristics of the functional molecules, such as electric resistance, the addition or substitution of certain functional groups and the like to components of the semiconductor devices, such as the size of corresponding openings, the composition of materials of contact pads and the like, a high degree of flexibility in adjusting the characteristics of the finally obtained contact structure may be achieved. For instance, different types of functional molecules may be applied without requiring additional lithography steps and/or without contributing to the complexity of the contact structure.

One illustrative semiconductor device disclosed herein comprises a first plurality of circuit elements formed in and above a first semiconductor layer. The device further comprises a second plurality of circuit elements formed in and above a second semiconductor layer, wherein the second semiconductor layer is positioned above the first semiconductor layer so as to form a stacked configuration. The semiconductor device further comprises a first contact pad formed in a first dielectric material that is formed between the first and second semiconductor layers. A second contact pad is formed in a second dielectric material which is formed between the first and second semiconductor layers and which is aligned to the first contact pad. Additionally, the semiconductor device comprises a carbon-containing substance comprising functional molecules, wherein the carbon-containing substance is formed between the first and second contact pads and wherein the functional molecules enable at least temporarily an electrical connection of the first and second contact pads.

One illustrative method disclosed herein comprises forming an opening in a dielectric material that is formed above a substrate of a semiconductor device, wherein the opening extends to a first contact region. The method additionally comprises forming a layer of a carbon-containing substance above the dielectric material and in the opening, wherein the carbon-containing substance comprises functional molecules having at least temporarily an electrical conductivity. Furthermore, the layer of a carbon-containing substance is removed from above the dielectric material outside the opening. Additionally, the method comprises contacting the functional molecules formed in the opening with a second contact region.

A further illustrative method disclosed herein comprises forming a molecular layer selectively on at least a portion of a first contact pad that is provided in a first dielectric material formed above a first substrate of a semiconductor device. The molecular layer contains functional molecules having a functional group so as to adhere to the at least a portion of the first contact pad, wherein the functional molecules are configured to provide, at least temporarily, electrical conductivity. Furthermore, the method comprises contacting the molecular layer by at least a portion of a second contact pad that is provided in a second dielectric material formed above a second substrate.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which well-established and cost-efficient CMOS process techniques may be employed in order to form a contact structure between two different device levels on the basis of functional molecules, which are to be understood as molecules having a size of approximately 0.5-100 nm or more, which are formed on the basis of polymer materials in combination with appropriately designed functional groups for endowing the functional molecules with desired characteristics. It should be appreciated that preparing appropriate functional molecules may be accomplished by specific chemical reactions based on providing appropriate components, which may be assembled into a desired large molecule by initiating a chemical reaction of the individual components, for instance by applying heat, radiation and the like. The chemical reaction may take place in any appropriate solution or may be initiated during a vapor phase deposition process in which the basic molecules may deposit on a surface and may react with other molecules in order to form a molecular film or layer. For instance, two-dimensional films or chains of a desired length may be formed on the basis of porphyrine, wherein an additional functional group may be incorporated into the two-dimensional layer or the one-dimensional molecule chain so as to obtain the desired characteristics, for instance with respect to conductivity and the like. In this manner, functional molecules may be obtained, for instance, in the above-specified size in the form of chains, which may thus be considered as "nano wires" which may be efficiently used as conductive paths by providing appropriately designed contact structures for connecting two different device levels, as will be explained later on in more detail. Furthermore, also nano tubes may be prepared with different lengths, which may additionally comprise functional groups so as to specifically design the characteristics of these molecules so that a specific conductivity may also be achieved.

In other cases, the functional molecules may have two or more different stable states with respect to one or more characteristics, such as conductivity and the like, wherein these "stable" states may respond to specific externally supplied stimuli, such as voltage, current, heat and the like, so that a controlled and reliable change of state may be initiated, while, without providing these external stimuli, the most recent state may be maintained. In this manner, the functional molecules may act as molecular switches, for instance by providing a state of high resistivity and a state of low resistivity, which may also be used for imparting an additional degree of freedom to a corresponding contact structure since corresponding interconnect structures may be selectively enabled and disabled in accordance with process and device requirements. For instance, appropriate molecular switches or functional molecules may be generated on the basis of AZO benzene, thereby forming appropriate molecules that may respond to an electric field by transitioning from a high ohmic state to a low ohmic state and vice versa. Also in this case, appropriate functional molecules may be formed in a wet chemical solution or may be composed during vapor phase deposition, wherein additional characteristics, such as adhesion to a substrate material, may be adjusted by adding appropriate functional groups, for instance in the form of sulfur, which is well known to form a stable covalent bond with metal species, such as gold and the like. Consequently, in some illustrative embodiments disclosed herein, the contact regions or contact pads of the different device layers may be appropriately adapted to the adhesion characteristics of the functional molecules, or vice versa, thereby enabling an efficient "patterning" of the molecular film, for instance on the basis of "mild" treatments, for instance in the form of a water rinse and the like, thereby removing an unwanted portion of the molecular film without negatively affecting the functional molecules adhering to the contact regions. In some illustrative embodiments, the adhesion characteristics of contact areas may be specifically adjusted on the basis of metal clusters and the like, which may be provided in a self-aligned manner, for instance on the basis of micelles having a specified size.

Consequently, based on the functional molecules, an efficient contact structure containing permanent or temporary connections may be established on the basis of approved volume production techniques, thereby enabling, in some illustrative embodiments, the formation of a stacked chip configuration with reduced manufacturing complexity and superior packing density with respect to "inter chip" connections.

Figure 1A:
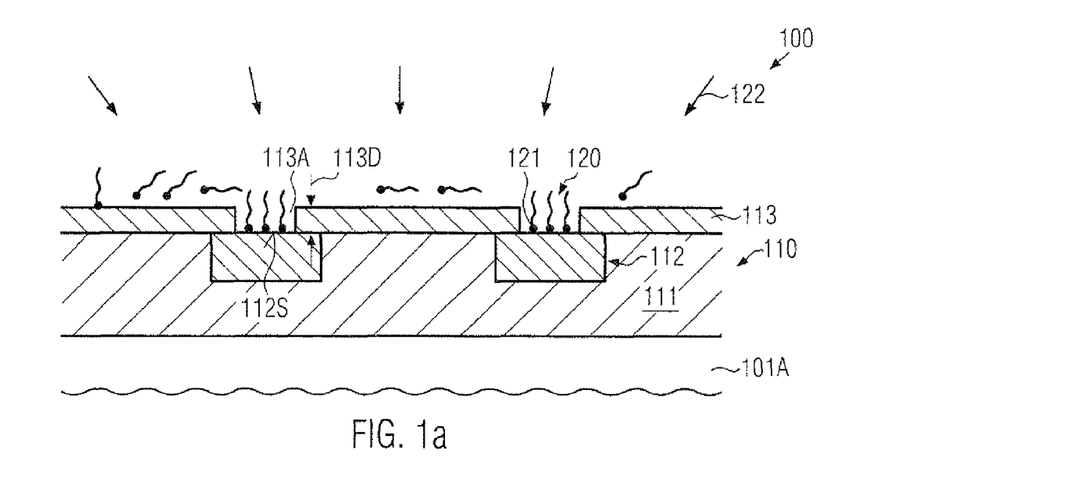
FIGS. 1a-1e schematically illustrate cross-sectional views of a semiconductor device during various manufacturing stages in providing a contact structure for connecting two different device levels on the basis of functional molecules, according to illustrative embodiments.

FIG. 1a schematically illustrates a cross-sectional view of a semiconductor device 100 which may comprise a substrate 101A above which may be formed a device level 110, which may represent any appropriate material 111 in combination with contact regions or contact pads 112. For example, the material 111 may represent a dielectric material, a semiconductor material and the like, in which the contact pads 112 may be embedded so as to be electrically insulated from each other. In other cases, the device level 110 may represent a portion of a metallization system of the semiconductor device 100, in which the material 111 may represent a dielectric material and the contact pads 112 may represent portions of metal regions, such as metal lines and the like. For example, in sophisticated applications the dielectric material of a metallization system for a semiconductor device may comprise a low-k dielectric material, as discussed above, in combination with highly conductive metals, such as copper, aluminum, silver and the like. The contact pads 112 may electrically connect to circuit elements which may be formed in and above a corresponding semiconductor layer (not shown), as will be explained later on in more detail. As previously explained, the contact pads 112 may have any appropriate size so as to comply with the device requirements for sophisticated semiconductor devices. For example, in currently available volume production techniques, circuit elements of the device 100 may be formed with critical dimensions of 40 nm and less.

Furthermore, in this manufacturing stage, the semiconductor device 100 may comprise a mask layer 113, which may represent any appropriate dielectric material, such as silicon dioxide, silicon nitride, silicon carbide, low-k dielectric materials and the like. The mask layer 113, which may also be used as an intermediate dielectric material between the device layer 110 and a further device layer to be provided in a later manufacturing stage, may comprise openings 113A that expose a portion of the contact pads 112, for instance a surface portion 112S. The openings 113A may have any appropriate lateral size and shape that is compatible with the manufacturing techniques available. On the other hand, a depth 113D of the openings 113A may be appropriately selected so as to be adapted to a length of functional molecules 120, which may be positioned within the openings 113A and on the mask layer 113 in this manufacturing stage. As previously explained, the functional molecules 120 may be provided in the form of elongated carbon-containing chains in which one or more functional groups may impart the desired characteristics to the molecules 120. In the embodiment shown, the molecules 120 may comprise a functional group 121 that may form a stable chemical bond with the material of the surface 112S. For example, sulfur may provide a stable chemical bond with materials such as gold, copper and the like. Thus, the molecules 120 may be provided with a length that may be selected in conformity with the depth 113D of the openings 113A such that the molecules 120 may be contacted at the other end in a later manufacturing stage. As discussed above, the length of the molecules 120 may be adjusted in a moderately broad range from approximately 1-100 nm or more. Thus, the depth 113D may, for a given length of the molecules 120, be adapted by selecting a corresponding thickness of the layer 113 and by controlling the corresponding patterning process in which the degree of overetching into the contact pads 112 may be appropriately adjusted.

The semiconductor device 100 as shown in FIG. 1a may be formed on the basis of the following process techniques. The material 111 may be formed above the substrate 101A on the basis of any appropriate deposition technique, followed by a lithography and etch sequence for patterning the material 111. Thereafter, a conductive material may be filled into the corresponding opening and any excess material may be removed, thereby obtaining the contact pads 112. In other cases, a portion of the material 111 may be provided, followed by the deposition of an appropriate material layer, which may then be patterned so as to obtain the contact pads 112, followed by a further deposition of material in order to complete the device layer 110. For example, the contact pads 112 may be formed of any appropriate material, such as copper, aluminum, gold, platinum, silver and the like, or any combination thereof, while, in other cases, at least the surface 112S may receive an appropriate species so as to provide the desired superior adhesion of the molecules 120. Next, the mask layer 113 may be deposited and may be patterned by lithography and well-established etch techniques. Thereafter, a molecular film may be deposited, for instance by applying a wet chemical solution containing the molecules 120 or by performing a CVD process. Due to the functional group 121 of the molecules 120, molecules 120 may adhere more strongly to the exposed portion of the surface 112S compared to the dielectric material 113. Thus, during the deposition process 122, the molecules 120 may be reliably provided within the openings 113A and may form a stable chemical bond with the exposed surface 112S. If required, during the deposition 122 or after the deposition, heat or radiation may be applied so as to enhance the adhesion of the molecules 120 to the surface 112S.

Figure 1B:
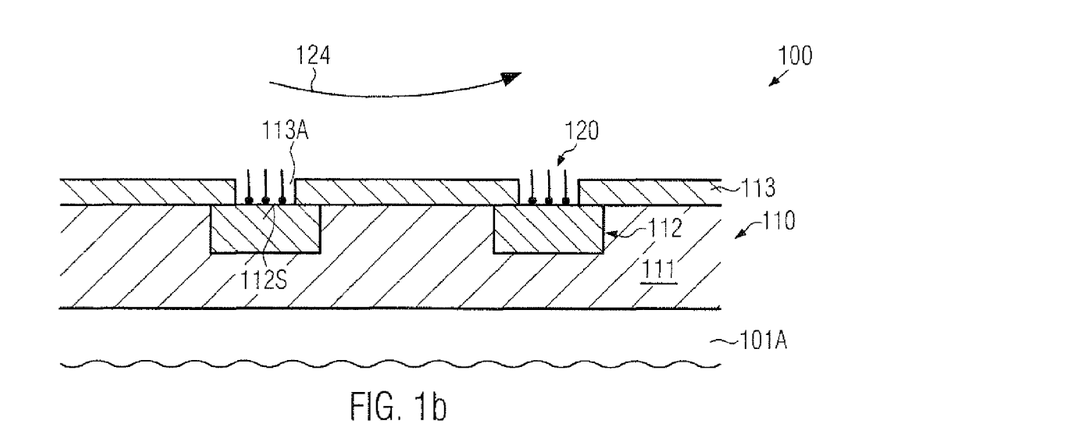

FIG. 1b schematically illustrates the device 100 during a removal process 124 in order to selectively remove the molecules 120 from the dielectric layer 113 while substantially maintaining the molecules 120 within the openings 113A. For this purpose, a wet removal process, such as rinsing in deionized water and the like, may be efficiently applied, due to the difference in bonding strength between the surface 112S and the dielectric material 113. Consequently, the functional molecules 120 may be maintained within the openings 113A, wherein an amount of molecules within the openings 113A is substantially determined by the lateral size thereof for a given configuration of the molecules 120.

Figure 1C:
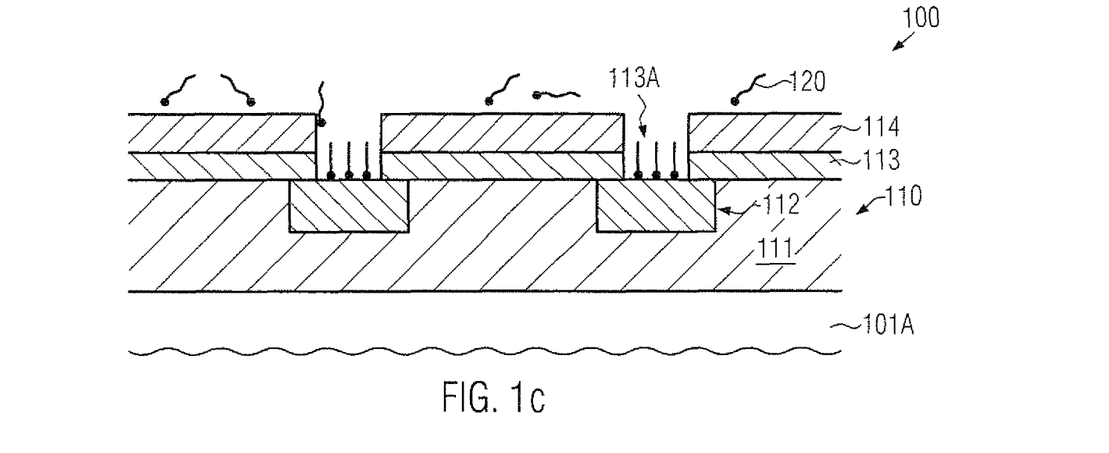

FIG. 1c schematically illustrates the semiconductor device 100 according to further illustrative embodiments in which an etch mask 114 may still be formed on the mask layer 113, wherein the molecules 120 may be deposited on the etch mask 114 and into the openings 113A. Thus, in this case, the unwanted molecules 120 may be efficiently removed by "lifting off" the etch mask 114 when adhesion of the molecules 120 to the contact pads 112 and to the material 113 may be comparable. The removal of the layer 114 and of the unwanted molecules 120 may be accomplished by any appropriate process, such as providing a solution of acetone and the like.

Figure 1D:
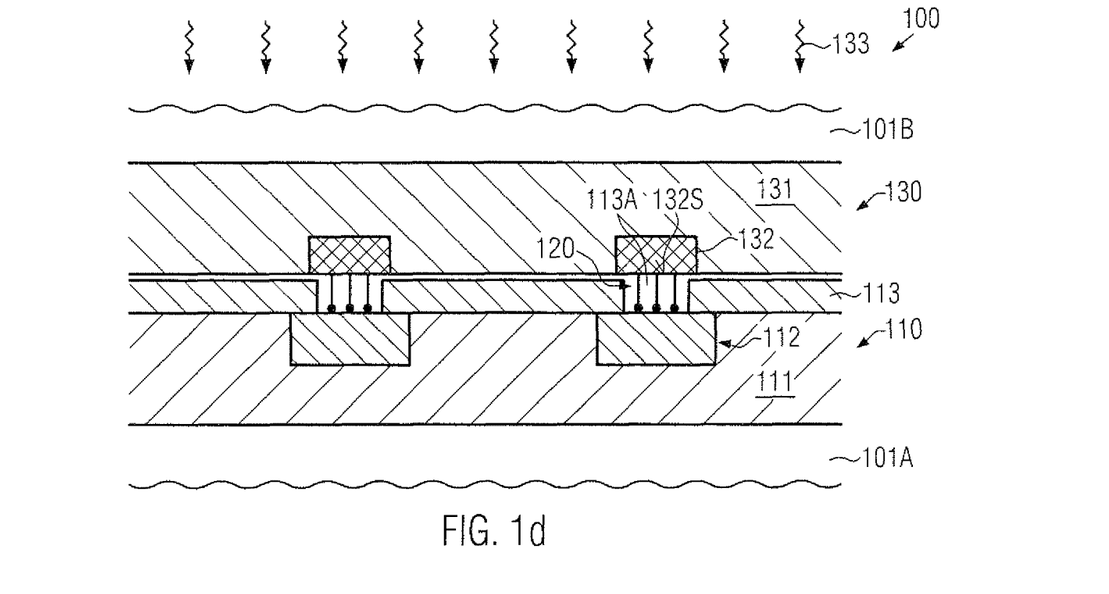

FIG. 1d schematically illustrates the semiconductor device 100 in a further advanced manufacturing stage. As illustrated, the device 100 may comprise a further device layer 130, which may, for instance, comprise a dielectric material 131 which may contain embedded therein further contact regions or contact pads 132 that are aligned to the contact pads 112. The device layer 130 may be formed above the dielectric material 113 on the basis of the substrate 101A, while in other cases, as illustrated in FIG. 1d, the device layer 130 may be formed on the basis of a separate substrate 101B, as will be explained later on in more detail. The contact pads 132 have an exposed surface portion 132S that may be in contact with the functional molecules 120, for instance by forming a stable chemical bond, which may be accomplished by appropriately selecting the material characteristics of the surface 132S and/or the characteristics of an additional functional group of the molecules 120, as for instance explained before.

With respect to any manufacturing techniques for forming the device layer 130, the same criteria may apply as previously referred to with respect to the device layer 110. In some embodiments, the layers 130, 110 may be formed on the basis of the individual substrates 101A, 101B and may be mechanically coupled during a process 133, thereby establishing the contact of the surface 132S with the molecules 120 due to the appropriately selected geometric configuration of the openings 113A in combination with the size of the molecules 120, as discussed above. Furthermore, if required, the process 133 for connecting the pads 132 to the functional molecules 120 may be performed on the basis of elevated temperatures, so as to initiate a reaction of the molecules 120 with the surface portion 132S, wherein a certain amount of mechanical pressure may also be applied, if required, so as to bond the material 131 to the intermediate dielectric material 113. In other cases, if required, an appropriate "glue" material may be provided at certain device areas in order to promote the adhesion between the layers 113 and 131.

Figure 1E:
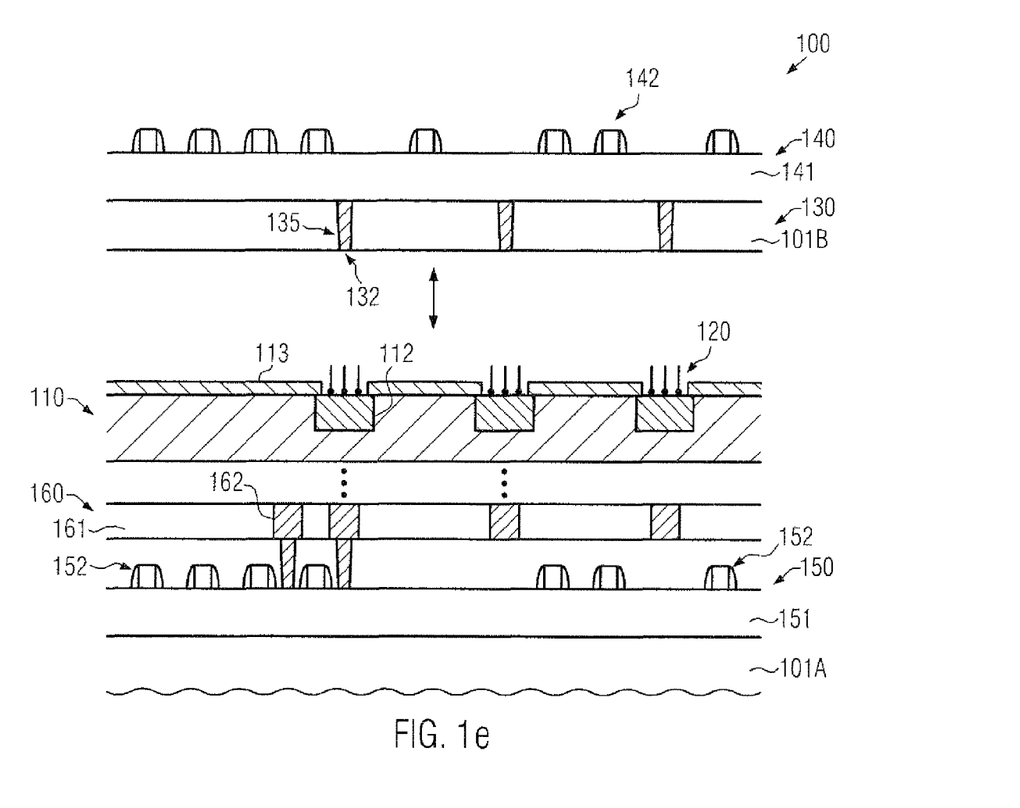

FIG. 1e schematically illustrates a cross-sectional view of the semiconductor device 100 according to further illustrative embodiments. As illustrated the device 100 may comprise the two individual substrates 101A, 101B which are still to be connected to each other. In the embodiment shown, a device layer 140 in the form of a semiconductor material 141 and circuit elements 142 formed in and above the semiconductor layer 141 may be provided above the device layer 130, which may comprise at least a significant portion of material of the substrate 101B in combination with corresponding contact elements 135, which may also be referred to as through-hole vias, since the contact elements 135 may extend through the substrate 101B. The through-hole vias 135 may connect to the contact pads 132, while, in other cases, an end portion of the contact elements 135 may represent the contact pads 132. Consequently, the through-hole vias 135 may connect the pads 132 with one or more of the circuit elements 142 of the device layer 140. In some illustrative embodiments, the circuit elements 142 may comprise semiconductor-based transistor elements having critical dimensions of 40 nm and less. For example, a critical dimension of transistors formed in accordance with CMOS technology may be a length of a gate electrode structure which may control a conductive channel of the transistors. For example, the circuit elements 142 may represent a portion or an entire complex circuit, such as a CPU, a GPU, a memory device and the like.

Similarly, a device layer 150 may be formed above the substrate 101A and may comprise circuit elements 152, such as transistors and the like, which may be formed in and above a semiconductor layer 151. With respect to any characteristics of these circuit elements 152, the same criteria may apply as are given for the circuit elements 142. Thus, the circuit elements 152 may also form a complex circuit, such as a CPU, a GPU and the like. Moreover, a metallization system 160 may be provided so as to provide the desired interconnection between the circuit elements 152 in accordance with the overall circuit requirements. As previously explained, the metallization system 160 may comprise a plurality of metallization layers, each of which may include metal lines 162 in combination with an appropriate dielectric material 161. Moreover, in the embodiment shown, the device layer 110 may be formed above the metallization system 160, thereby representing a final level of the metallization system 160 in order to provide the contact pads 112. In the embodiment shown, the functional molecules 120 may be provided within openings of the layer 113 that represents the part of the device layer 110. In other embodiments, the layer 113 in combination with the functional molecules 120 may be formed "on" the layer 130, i.e., on the substrate 101B, so that the functional molecules 120 may first be bonded to the contact pads 132 prior to connecting the substrates 101B, 101A. In this manufacturing stage, the device layer 130, i.e., the substrate 101b, may be connected to the device layer 110, thereby also establishing a contact between the functional molecules 120 and the contact pads 132, as discussed above. The resulting stacked configuration of the substrates 101A, 101B and the various device layers formed thereon may thus provide a high volume packing density in terms of the circuit elements 142 and 152, wherein an efficient electrical connection between the circuit elements 142 and 152 may be established via the functional molecules 120, without requiring complex bond or bump structures.

It should be appreciated that the functional molecules 120 may also provide the possibility of being disabled and enabled in a controlled manner, for instance by applying an electric field and the like, which may allow selectively activating or de-activating corresponding interconnect channels between device layers formed in and above the substrate 101B and device layers formed in and above the substrate 101A.

Figure 1F:
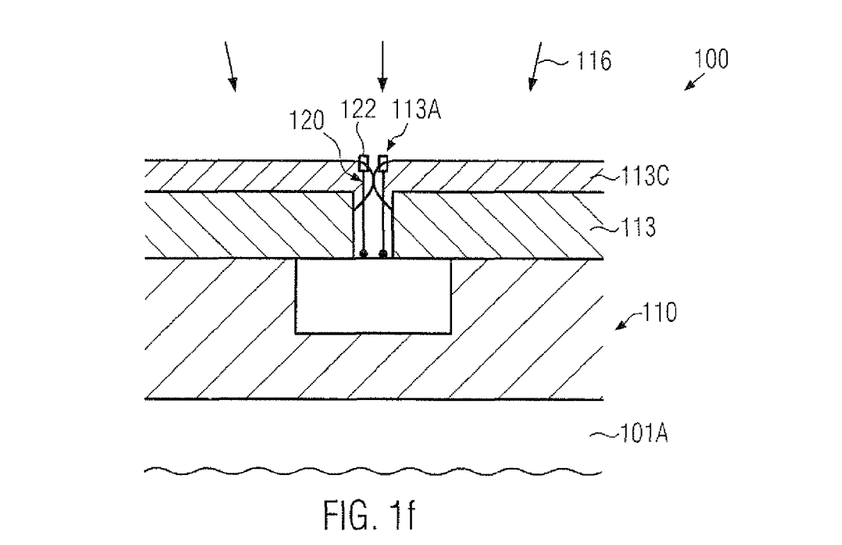
FIG. 1f schematically illustrates a cross-sectional view of a manufacturing stage in combining two individual semiconductor chips on the basis of functional molecules in order to provide a stacked chip configuration, according to illustrative embodiments.

FIG. 1f schematically illustrates the semiconductor device 100 according to further illustrative embodiments in which superior integrity of the functional molecules 120 may be obtained. As illustrated, the functional molecules 120 are positioned within the opening 113A, which may be accomplished on the basis of techniques as described above or as will be described later on in more detail. Furthermore, the functional molecules 120 may have an appropriate end portion 122, for instance in the form of a functional group, so as to enable contact to a contact pad in a later manufacturing stage. Moreover, the device 100 is exposed to a deposition ambient 116 in which a protective material 113C may be deposited so as to at least partially fill the opening 113A, thereby "passivating" the molecules 120. For example, appropriate polymer materials may be deposited when these materials provide the required material characteristics for the further processing of the device 100. In other cases, the deposition process 116 may represent a vapor phase deposition process in which an appropriate material, such as silicon dioxide and the like, may be deposited such that the opening 113A may be closed without significantly filling a lower portion of the opening 113A. Consequently, during the process 116, an "air gap" may be formed within the opening 113A, thereby providing superior integrity of the molecules 120 during the further processing. If desired, a mild removal process may be performed, for instance in the form of chemical mechanical polishing (CMP), etching and the like, so as to reliably expose the end portions 122 without unduly affecting the remaining portions of the molecules 120. Thereafter, the further processing may be continued by contacting the molecules 120, as explained above.

Figure 1G:
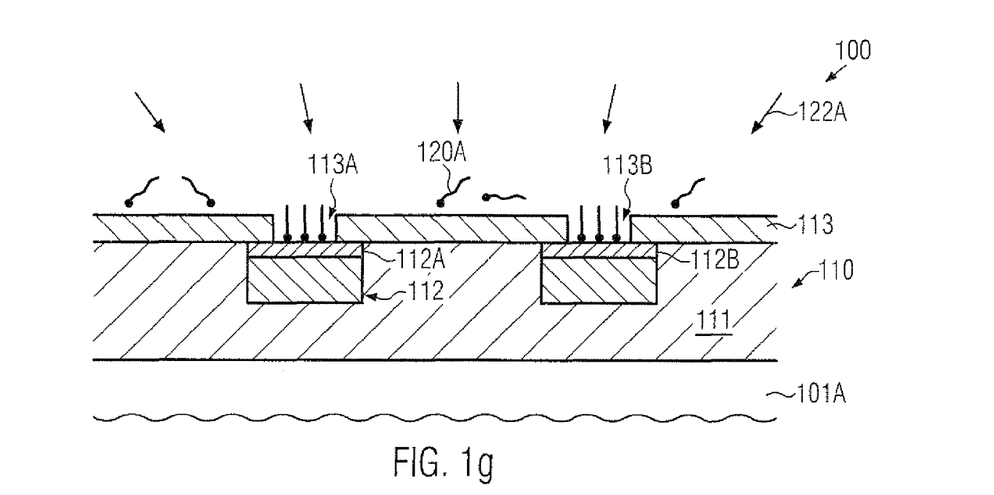
FIG. 1g schematically illustrates the semiconductor device in a manufacturing stage in which functional molecules may be positioned in an opening with increased integrity, according to illustrative embodiments.

FIG. 1g schematically illustrates the semiconductor device 100 according to further illustrative embodiments in which different types of functional molecules may be provided. As illustrated, during a first deposition process 122A, functional molecules 120A are deposited on the layer 113 and within openings 113A and 113B. Furthermore, the contact pads 112 may have different surface areas 112A, 112B which may provide a different degree of adhesion of the molecules 120A. For instance, the molecules 120A may strongly adhere to the surface material 112A, while the adhesion to the material 112B may be significantly less. Consequently, during a corresponding removal process, for instance based on de-ionized water, the molecules 120A may be efficiently removed outside the opening 113A.

Figure 1H:
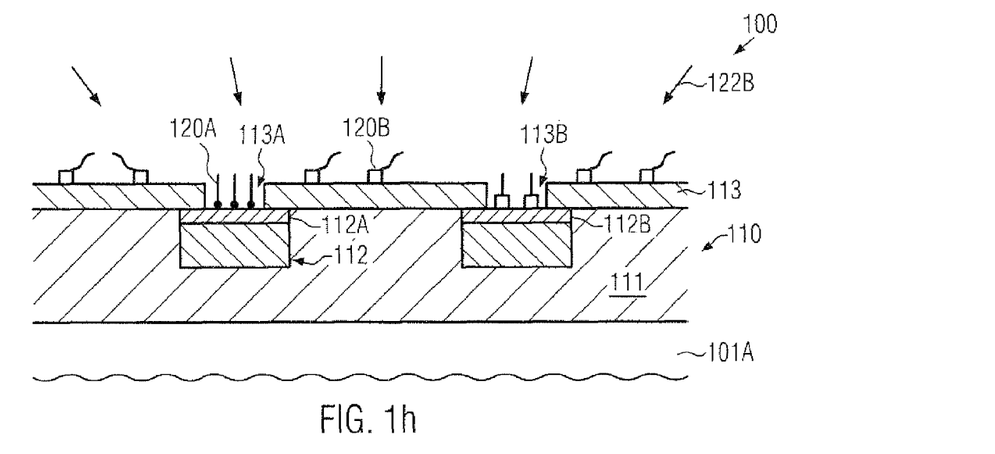
FIGS. 1h-1j schematically illustrate cross-sectional views of the semiconductor device in which different types of functional molecules may be used without requiring a process for patterning the different molecular films, according to illustrative embodiments.

FIG. 1h schematically illustrates the device 100 in a further advanced manufacturing stage, i.e., during a further deposition process 122B, in which a different type of functional molecules 120B may be deposited. In this case, the molecules 120B may have a functional group so as to strongly adhere to the surface 112B. Thus, upon a further removal process, any unwanted molecules 120B may be reliably removed outside the opening 113B.

Figure 1I:
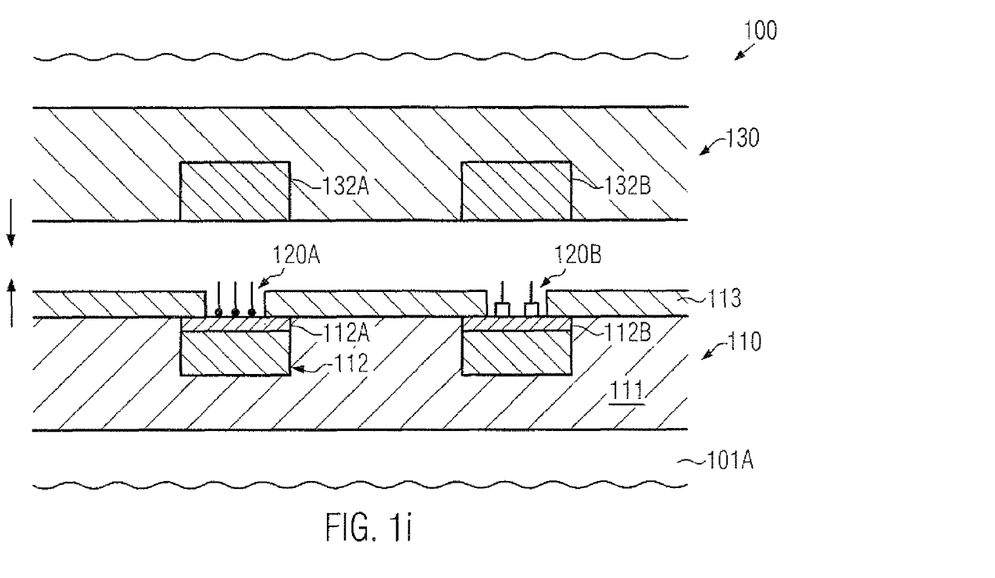

FIG. 1i schematically illustrates the semiconductor device 100 in a process stage in which the device layers 110 and 130 are connected to each other such that a contact pad 132A connects to the functional molecules 120A and a second contact pad 132B connects to the functional molecules 120B. Thus, interconnect structures with different characteristics, for instance in terms of conductivity, controllability and the like, may be established without requiring additional patterning steps after forming the mask layer 113.

Figures 1J, 1K:
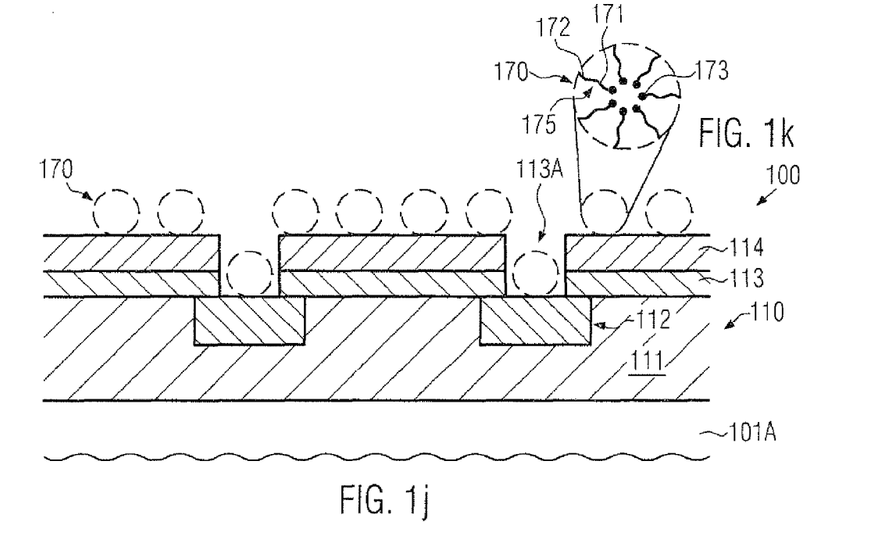
FIGS. 1k-1m schematically illustrate cross-sectional views of the semiconductor device during various manufacturing stages when one or more types of functional molecules are provided on the basis of an additional cluster forming material that may be positioned on the basis of micelles, according to still further illustrative embodiments.

FIG. 1j schematically illustrates the semiconductor device 100 according to further illustrative embodiments in which the adhesion of the contact pads 112 may be adjusted immediately prior to applying the functional molecules. As illustrated, a mask layer 114, such as a resist material, may be formed on the dielectric material 113. Furthermore, a molecular film comprising micelles 170 may be formed above the layer 114 and within the openings 113A.

FIG. 1k schematically illustrates a schematic and enlarged view of the micelles 170. As shown, the micelles 170 may represent agglomerations of copolymers 175 having a metal cluster 173 formed therein. The copolymers may have a first polymer chain 171 and a polymer chain 172, thereby forming an amphilphile atom, which may result in the formation of the micelle 170 when dissolved in an apolar solution. Since the individual sizes of the polymer chains 171 and 172 may be selected in any appropriate manner, the size of the micelles 170 may be appropriately adjusted in view of the lateral size of the openings 113A so as to enable a well-defined incorporation of micelles 170 within the openings 113A. Consequently, a well-defined amount of metal species contained in the functional groups 173 may be introduced into the openings 113A.

Figure 1L:
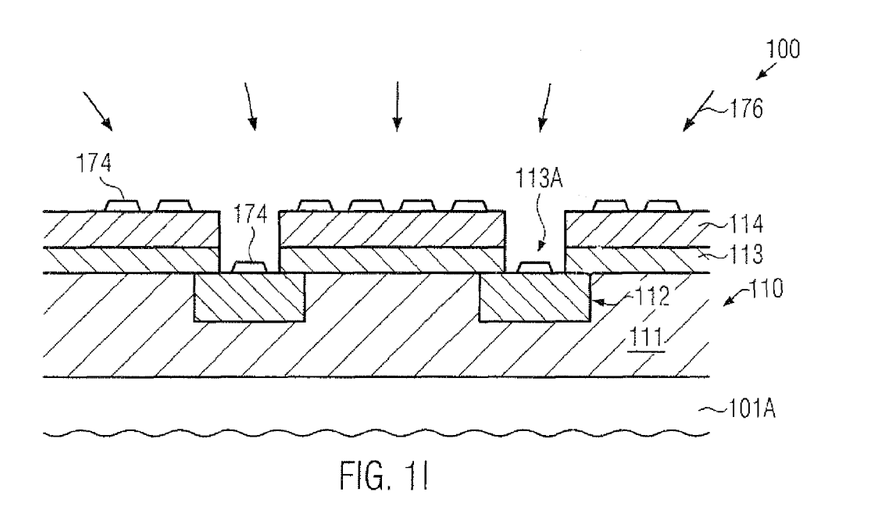

FIG. 1l schematically illustrates the semiconductor device 100 when exposed to a reactive process ambient 176, such as a plasma ambient obtained on the basis of oxygen, hydrogen and the like. During exposure to the ambient 176, the polymer components of the micelles 170 (FIG. 1k) may be removed selectively with respect to the metal species 173, thereby forming clusters 174 on the layer 114 and within the openings 113A. Consequently, the clusters 174 in the openings 113A may be provided with well-defined characteristics in view of material composition and size, thereby also providing a well-defined "anchor point" for the functional molecules to be positioned within the openings 113A. The layer 114 may be removed, for instance by applying an appropriate solution, without unduly affecting the clusters 174 within the openings 113A.

Figure 1M:
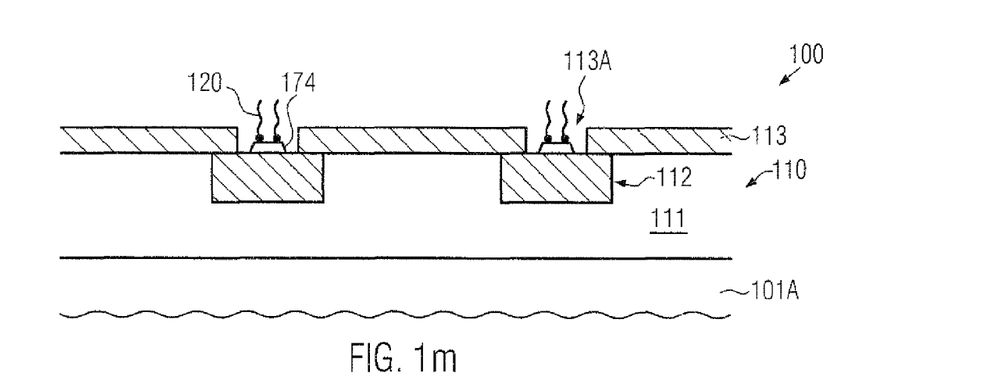

FIG. 1m schematically illustrates the device 100 with the functional molecules 120 bonded to the clusters 174 within the openings 113A, which may be accomplished on the basis of a process sequence as described before, wherein an increased flexibility may be accomplished with respect to selecting materials for the contact pads 112, since the adhesion characteristics may be provided by the cluster 174. Thereafter the further processing may be continued as discussed above.

As a result, the present disclosure provides semiconductor devices and manufacturing techniques in which a contact between different device levels, such as different semiconductor chips, may be established on the basis of functional molecules without requiring complex bump or bond structures. Consequently, an efficient stacked chip configuration may be formed on the basis of a densely packed contact structure, wherein a molecular film containing the functional molecules may be "patterned" on the basis of CMOS compatible techniques. Consequently, the advantages provided by functional molecules may be efficiently combined with volume production techniques of micro electronic technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an opening in a dielectric material that is formed above a substrate of a semiconductor device, said opening extending to a first contact region;
    forming a layer of a carbon-containing substance above said dielectric material and in said opening, said carbon-containing substance comprising functional molecules having at least temporarily an electrical conductivity;

removing said layer of a carbon-containing substance from above said dielectric material outside of said opening; and contacting said functional molecules formed in said opening with a second contact region, wherein contacting said functional molecules with a second contact region comprises forming said second contact region above a second substrate and mechanically coupling said substrate and said second substrate so as to form a stacked configuration.

2. The method of claim 1, wherein forming said layer of a carbon-containing substance comprises providing said functional molecules so as to have a functional group adhering to a surface portion of said contact region.

3. The method of claim 2, wherein said surface portion comprises a metal and said functional group is selected so as to form a chemical bond with said metal.

4. The method of claim 3, wherein said metal is at least one of gold and copper.

5. The method of claim 1, further comprising forming an adhesion cluster on said contact region prior to forming said layer of a carbon-containing substance.

6. The method of claim 5, wherein forming said adhesion cluster comprises applying a solution that contains micelles including a metal cluster and selectively removing a polymer material so as to form said adhesion cluster.

7. The method of claim 6, wherein a size of said micelles is adapted to a size of said opening.

8. The method of claim 1, wherein removing said layer of a carbon-containing substance outside said opening comprises performing a wet removal process.

9. A method, comprising:
forming a molecular layer selectively on at least a portion of a first contact pad that is provided in a first dielectric material formed above a first substrate of a semiconductor device, said molecular layer containing functional molecules having a functional group so as to adhere to said at least a portion of the first contact pad, said functional molecules being configured to provide at least temporarily electric conductivity; and contacting said molecular layer by at least a portion of a second contact pad that is provided in a second dielectric material formed above a second substrate.

10. The method of claim 9, wherein forming said molecular layer selectively on at least a portion of said first contact pad comprises globally applying said molecular layer and performing a non-masked wet removal process so as to remove said molecular layer from said first dielectric material.

11. The method of claim 9, wherein forming said molecular layer selectively on at least a portion of said first contact pad comprises forming a dielectric mask material above said first dielectric material, patterning said dielectric mask material so as to expose said at least a portion prior to applying said molecular layer.

12. The method of claim 10, further comprising forming a dielectric mask material above said second dielectric material and said second contact pad, forming an opening in said dielectric mask material so as to expose said at least a portion of said second contact pad and connecting said first and second substrates so as to receive said functional molecules in said opening.

13. The method of claim 9, wherein said functional molecules are formed on the basis of at least one of porphyrin and AZO benzene.

* * * * *